United States Patent
Kittl et al.

(10) Patent No.: US 9,406,508 B2
(45) Date of Patent: Aug. 2, 2016

(54) METHODS OF FORMING A SEMICONDUCTOR LAYER INCLUDING GERMANIUM WITH LOW DEFECTIVITY

(71) Applicant: Samsung Electronics Co., Ltd., Suwon-si (KR)

(72) Inventors: Jorge A. Kittl, Round Rock, TX (US); Mark S. Rodder, Dallas, TX (US)

(73) Assignee: Samsung Electronics Co., Ltd. (KR)

( * ) Notice: Subject to any disclaimer, the term of this patent is extended or adjusted under 35 U.S.C. 154(b) by 81 days.

(21) Appl. No.: 14/480,869

(22) Filed: Sep. 9, 2014

(65) Prior Publication Data

US 2015/0118829 A1   Apr. 30, 2015

Related U.S. Application Data

(60) Provisional application No. 61/898,044, filed on Oct. 31, 2013.

(51) Int. Cl.
*H01L 21/02* (2006.01)
*H01L 21/20* (2006.01)

(52) U.S. Cl.
CPC .... *H01L 21/02664* (2013.01); *H01L 21/02488* (2013.01); *H01L 21/02505* (2013.01); *H01L 21/02532* (2013.01)

(58) Field of Classification Search
CPC .................. H01L 21/02532; H01L 21/02381; H01L 21/0245
See application file for complete search history.

(56) References Cited

U.S. PATENT DOCUMENTS

| | | | |
|---|---|---|---|
| 6,214,702 B1 | 4/2001 | Kim | |
| 6,828,580 B2 | 12/2004 | Zhang | |
| 6,855,436 B2 * | 2/2005 | Bedell | H01L 21/26506 257/E21.335 |
| 7,067,400 B2 * | 6/2006 | Bedell | H01L 21/32105 257/E21.301 |
| 7,632,724 B2 | 12/2009 | Chidambarrao et al. | |
| 7,648,863 B2 | 1/2010 | Isikawa | |
| 7,888,197 B2 | 2/2011 | Chidambarrao et al. | |
| 8,071,872 B2 | 12/2011 | Atanackovic | |
| 8,120,039 B2 | 2/2012 | Ono et al. | |
| 8,466,500 B2 | 6/2013 | Zhu et al. | |
| 2010/0044836 A1 * | 2/2010 | Damlencourt | H01L 21/02203 257/616 |
| 2015/0097244 A1 * | 4/2015 | Liu | H01L 27/1211 257/351 |

OTHER PUBLICATIONS

Gunji et al. "Strain relaxation mechanisms in compressively strained thin SiGe-on-insulator films grown by selective Si oxidation", *Journal of Applied Physics*, 109:014324 (2011).

Nakaharai et al. "Characterization of 7-nm-thick strained Ge-on-insulator layer fabricated by Ge-condensation technique", *Applied Physics Letters*, vol. 83, No. 17, Oct. 27, 2003, 3516-3518.

(Continued)

*Primary Examiner* — Eric Ward
(74) *Attorney, Agent, or Firm* — Myers Bigel & Sibley, P.A.

(57) ABSTRACT

Methods of forming a semiconductor layer including germanium with low defectivity are provided. The methods may include sequentially forming a silicate glass layer, a diffusion barrier layer including nitride and an interfacial layer including oxide on a substrate. The methods may also include forming a first semiconductor layer on the interfacial layer and converting a portion of the first semiconductor layer into a second semiconductor layer having a germanium concentration therein that is higher than a germanium concentration of the first semiconductor layer.

20 Claims, 8 Drawing Sheets

(56) References Cited

OTHER PUBLICATIONS

Yin "Strain Relaxation of SiGe on Complaint BPSG and Its Applications", Dissertation Presented to the Faculty of Princeton University, Nov. 2004, 161 Pages.

Yin et al. "High-germanium-content SiGe islands formed on compliant oxide by SiGe oxidation", *Applied Physics Letters*, vol. 84, No. 18, May 3, 2004, pp. 3624-3626.

Yin et al. "Ultrathin Strained-SOI by Stress Balance on compliant Substrates and FET Performance", *IEEE Transactions on Electron Devices*, vol. 52, No. 10, Oct. 2005, 2207-2214.

* cited by examiner

METHODS OF FORMING A SEMICONDUCTOR LAYER INCLUDING GERMANIUM WITH LOW DEFECTIVITY

REFERENCE TO PRIORITY APPLICATION

This application is related to and claims the priority of U.S. Provisional Application Ser. No. 61/898,044, entitled METHODS OF FORMING LOW DEFECTIVITY HIGH GE CONTENT SIGE OR GE ON INSULATOR BY GE CONDENSATION TECHNIQUE, filed in the USPTO on Oct. 31, 2013, the entire disclosure of which is incorporated herein by reference.

FIELD

The present disclosure generally relates to the field of electronics, and more particularly integrated circuit devices.

BACKGROUND

Germanium (Ge) channels or high germanium content silicon germanium (SiGe) channels have been studied to improve device performances. However, germanium layers or high germanium content silicon germanium layers formed on a silicon substrate may include various defects due to lattice mismatches between the silicon substrate and the germanium layers or high germanium content silicon germanium layers and may thus increase undesired leakage.

A germanium condensation process using an oxidation process has been proposed to reduce defects due to lattice mismatches between a silicon substrate and germanium layers or high germanium content silicon germanium layers. However, the germanium condensation process may result in strain built in germanium layers or high germanium content silicon germanium layers and may cause extended defects.

SUMMARY

A method of forming an integrated circuit device may include forming a stacked structure on a substrate. The stacked structure may include a silicate glass layer, a diffusion barrier layer including nitride on the silicate glass layer, and an interfacial layer including oxide on the diffusion barrier layer. The method may also include forming a first semiconductor layer on the stacked structure such that the interfacial layer is disposed between the diffusion barrier layer and the first semiconductor layer. The method may further include converting at least a portion of the first semiconductor layer into a second semiconductor layer having a germanium concentration therein that is higher than a germanium concentration of the first semiconductor layer.

According to various embodiments, converting at least a portion of the first semiconductor layer may include forming a third semiconductor layer, including germanium, directly contacting the first semiconductor layer and oxidizing the third semiconductor layer to drive germanium therein into the first semiconductor layer.

In various embodiments, oxidizing the third semiconductor layer may be performed at a temperature higher than a reflow temperature of the silicate glass layer. The silicate glass layer may include borophosphosilicate glass (BPSG), phosphorus silicate glass (PSG) or boron silicate glass (BSG).

In various embodiments, the method may additionally include forming a capping oxide layer on the third semiconductor layer prior to oxidizing the third semiconductor layer.

According to various embodiments, the diffusion barrier layer may include a silicon nitride layer. A thickness of the silicon nitride layer may be in a range of about 0.5 nm to about 10 nm.

According to various embodiments, forming the diffusion barrier layer may include implanting nitrogen ions into an upper surface of the silicate glass layer.

According to various embodiments, interfacial layer may include a silicon oxide layer. The silicon oxide layer may be formed by a thermal oxidation process. A thickness of the silicon oxide layer may be in a range of about 0.5 nm to about 10 nm.

A method of forming a semiconductor on insulator substrate may include forming a handling wafer. Forming the handling wafer may include forming a silicate glass layer on a handling substrate and forming a diffusion barrier layer including nitride on the silicate glass layer. The silicate glass layer may extend between the handling substrate and the diffusion barrier layer.

According to various embodiments, forming the handling wafer may further include forming an interfacial layer on the diffusion barrier layer. The diffusion barrier layer may extend between the silicate glass layer and the interfacial layer. The method may also include transferring a first semiconductor layer from a donor wafer onto the handling wafer. The first semiconductor layer may contact the interfacial layer. Additionally, the method may include converting at least a portion of the first semiconductor layer into a second semiconductor layer having a germanium concentration therein that is higher than a germanium concentration of the first semiconductor layer.

According to various embodiments, the method may also include transferring a first semiconductor layer and an interfacial layer, which are sequentially stacked on a donor substrate, onto the handling wafer. The interfacial layer may contact the diffusion barrier layer. The method may further include converting at least a portion of the first semiconductor layer into a second semiconductor layer having a germanium concentration therein that is higher than a germanium concentration of the first semiconductor layer.

In various embodiments, converting at least a portion of the first semiconductor layer may include forming a third semiconductor layer, including germanium, directly contacting the first semiconductor layer and oxidizing the third semiconductor layer to drive germanium therein into the first semiconductor layer.

In various embodiments, oxidizing the third semiconductor layer may be performed at a temperature higher than a reflow temperature of the silicate glass layer.

According to various embodiments, the diffusion barrier layer may be a silicon nitride layer. A thickness of the silicon nitride layer may be in a range of about 0.5 nm to about 10 nm.

In various embodiments, interfacial layer may be a silicon oxide layer. A thickness of the silicon oxide layer is in a range of about 0.5 nm to about 10 nm.

DETAILED DESCRIPTION

Figure 1:
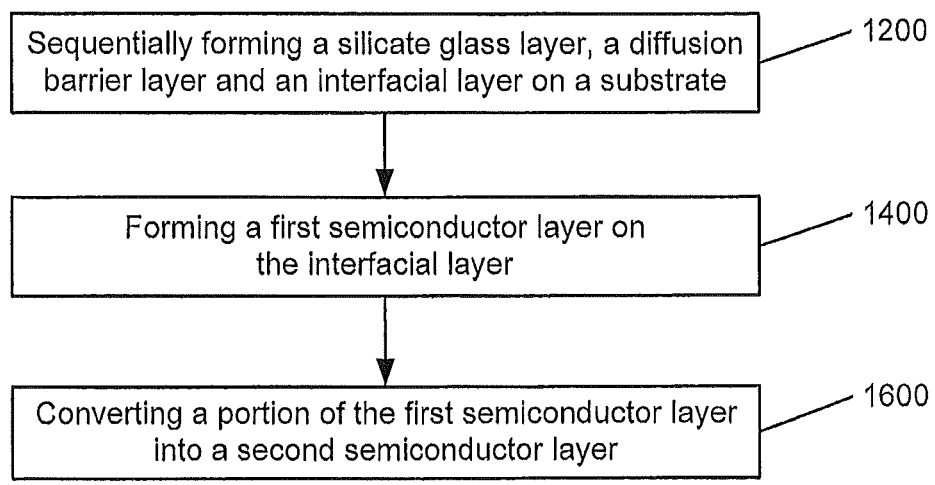
FIG. 1 is a flowchart illustrating a method of forming a semiconductor layer including germanium according to some embodiments of the present inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concept are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on" another element, it can be directly coupled, connected, or responsive to, or on the other element, or intervening elements may also be present. In contrast, when an element is referred to as being "directly coupled," "directly connected," or "directly responsive" to, or "directly on" another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added or inserted between the blocks that are illustrated, and blocks/operations may be omitted without departing from the scope of the present inventive concept.

Figure 2:
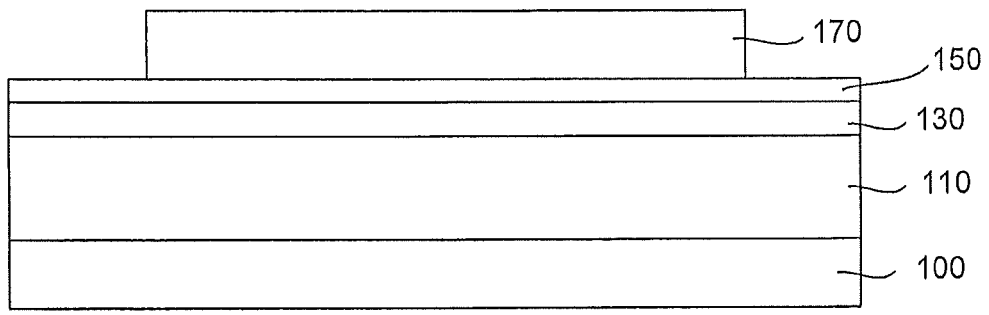
FIG. 2 is a cross-sectional view illustrating an intermediate structure provided in a method of forming a semiconductor layer including germanium according to some embodiments of the present inventive concept.

FIG. 1 is a flowchart illustrating a method of forming a semiconductor layer including germanium according to some embodiments of the present inventive concept. FIG. 2 is a cross-sectional view illustrating an intermediate structure provided in a method of forming a semiconductor layer including germanium according to some embodiments of the present inventive concept.

Referring to FIGS. 1 and 2, the method may include sequentially forming a silicate glass layer 110, a diffusion barrier layer 130 and an interfacial layer 150 on a substrate 100 (Block 1200). The substrate 100 may be, for example, a bulk silicon substrate or a semiconductor on insulator (SOI) (e.g., silicon on insulator). In some embodiments, the substrate 100 may include one or more semiconductor materials, for example, Si, Ge, SiGe, GaP, GaAs, SiC, SiGeC, InAs or InP.

The silicate glass layer 110 may include impurities, for example, boron or phosphorous. For example, the silicate glass layer 110 may be borophosphosilicate glass (BPSG), phosphorus silicate glass (PSG) or boron silicate glass (BSG). The silicate glass layer 110 may have a reflow temperature lower than a process temperature of a Ge condensation process, which may be subsequently performed.

The diffusion barrier layer 130 may be a continuous layer that is substantially free of pin-holes to effectively reduce diffusion of impurities in the silicate glass layer 110 into the interfacial layer 150. A thickness of the diffusion barrier layer 130 may be in a range of about 0.5 nm and to about 10 nm. In some embodiments, the thickness of the diffusion barrier layer 130 may be thin enough to adjust its size during a Ge condensation process without introducing excessive strain.

The diffusion barrier layer 130 may include nitride and may be, for example, silicon nitride, silicon oxynitride or aluminum nitride. In some embodiments, the diffusion barrier layer 130 may be, for example, silicon oxycarbide, $Si_xO_yN_zC_w$, silicon carbides, $Hf_xSi_yO_zN_w$, $Hf_xSi_yN_w$, $Zr_xSi_yO_zN_w$, $Zr_xSi_yN_w$ or compounds with rare-earths (e.g., $La_xSi_yN_w$). The diffusion barrier layer 130 may be a single layer or a stack including multiple layers.

The diffusion barrier layer 130 may be formed using a deposition process, for example, a chemical vapor deposition (CVD) process or an atomic layer deposition (ALD) process. In some embodiments, the diffusion barrier layer 130 may be formed using a nitridation process. Specifically, the substrate 100 including the silicate glass layer 110 may be placed in a nitridation process chamber and an upper portion of the silicate glass layer 110 may be nitridized. The nitridation process may be, for example, a plasma nitridation process.

The interfacial layer 150 may be formed to provide a good interface, which has a low density of interface states. A thickness of the interfacial layer 150 may be in a range of about 0.5 nm and to about 10 nm. The interfacial layer 150 may include oxide and may be, for example, $SiO_2$, $Si_xGe_yO_w$, $Hf_xSi_yO_z$, $Hf_xSi_yGe_wO_z$, $HfO_2$, $Al_2O_3$, rare-earth metal oxides, or compounds thereof (e.g., rare-earth silicates). In some embodiments, the interfacial layer 150 may include High-K dielectrics. The interfacial layer 150 may be formed by, for example, a deposition process. Specifically, the interfacial layer 150 may be deposited on the diffusion barrier layer 130 using a deposition process. In some alternative embodiments, the interfacial layer 150 may be deposited directly on the silicate glass layer 110 and then the diffusion barrier layer 130 may be formed by implanting nitrogen through the interfacial layer 150.

The method may also include forming a first semiconductor layer 170 on the interfacial layer 150 (Block 1400). The first semiconductor layer 170 may contact an upper surface of the interfacial layer 150. The first semiconductor layer 170 may include silicon and, in some embodiments, the first semiconductor layer 170 may be a substantially pure silicon layer. The first semiconductor layer 170 may include silicon and germanium. A thickness of the first semiconductor layer 170 may be in a range of about 2 nm (nanometer) to about 200 nm.

The method may further include converting a portion of the first semiconductor layer 170 into a second semiconductor layer, which may have a germanium concentration higher than a germanium concentration of the first semiconductor layer (Block 1600).

Figure 3:
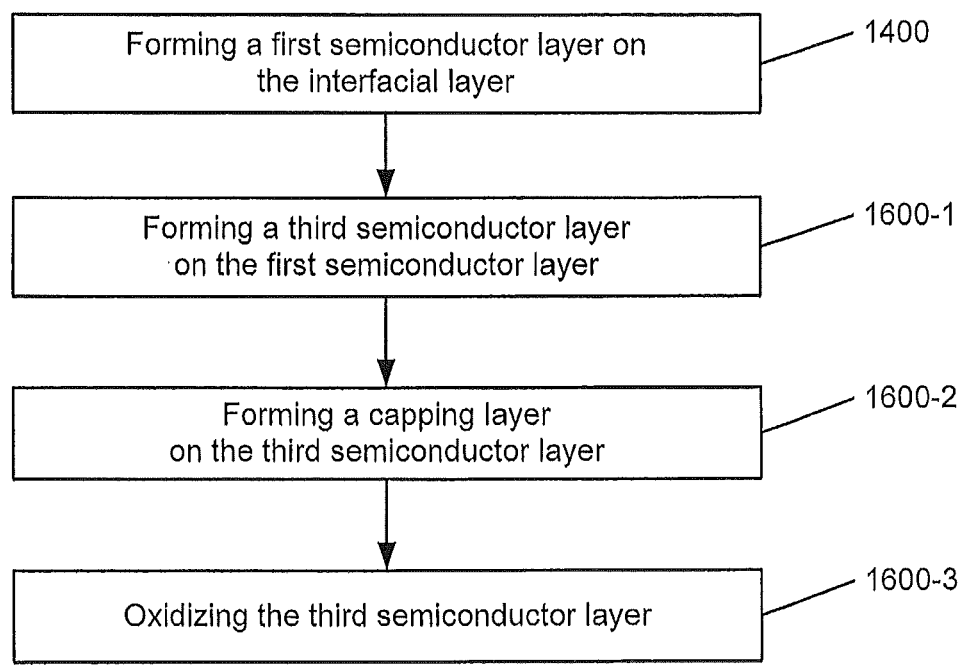
FIG. 3 is a flowchart illustrating a method of forming a semiconductor layer including germanium according to some embodiments of the present inventive concept.
Figure 4:
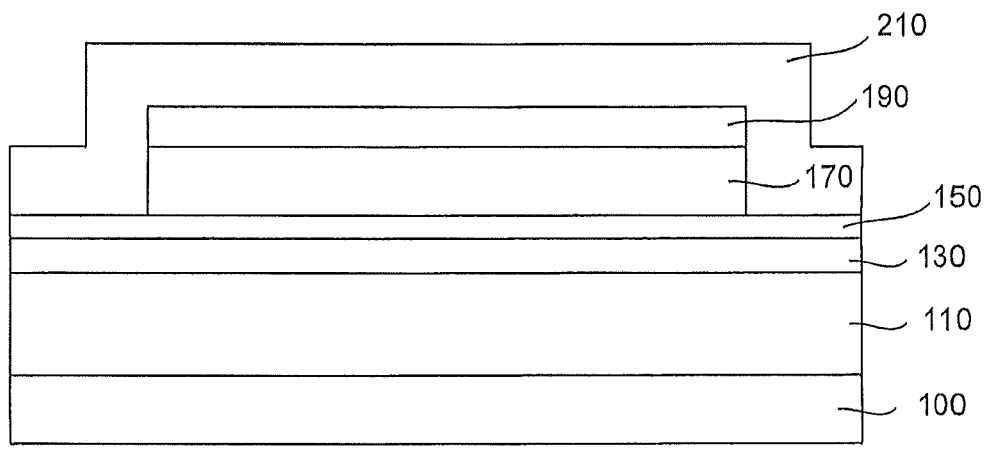
FIG. 4 is a cross-sectional view illustrating an intermediate structure provided in a method of forming a semiconductor layer including germanium according to some embodiments of the present inventive concept.

FIG. 3 is a flowchart illustrating a method of forming a semiconductor layer including germanium according to some embodiments of the present inventive concept. FIG. 4 is a cross-sectional view illustrating an intermediate structure provided in a method of forming a semiconductor layer including germanium according to some embodiments of the present inventive concept.

Referring to FIGS. 3 and 4, converting a portion of the first semiconductor layer 170 into a second semiconductor layer may be performed by a Ge condensation process using an oxidation process. Specifically, converting a portion of the first semiconductor layer 170 may include forming a third semiconductor layer 190 on the first semiconductor layer 170 (Block 1600-1). The third semiconductor layer 190 may be a compound semiconductor layer including germanium. A germanium concentration of the third semiconductor layer 190 may be in a range of about 10% to about 100%; however, other concentrations are possible. In some embodiments, the third semiconductor layer 190 may be a substantially pure germanium layer.

The third semiconductor layer 190 may be single crystal as deposited or may be converted into single crystal layer through a re-growth process at a low temperature after the third semiconductor layer 190 is deposited. A thickness of the third semiconductor layer 190 may be in a range of about 2 nm to about 200 nm.

The third semiconductor layer 190 may contact an upper surface of the first semiconductor layer 170 as illustrated in FIG. 4. It may be understood that the first semiconductor layer 170 may be patterned before forming the third semiconductor layer 190. In some embodiments, the third semiconductor layer 190 may contact a sidewall of the first semiconductor layer 170.

In some embodiments, a capping layer 210 may be formed on the third semiconductor layer 190 (Block 1600-2). The capping layer 210 may reduce buckling of the first semiconductor layer 170 during an oxidation process, which may be subsequently performed and/or may improve uniformity of germanium concentration of the second semiconductor layer. In some embodiments, the capping layer 210 may not be formed.

The capping layer 210 may be, for example, a silicon oxide layer and may be formed using, for example, a Plasma-enhanced chemical vapor deposition (PECVD). A thickness of the capping layer 210 may be in a range of about 2 nm to about 200 nm.

According to FIG. 3, converting a portion of the first semiconductor layer may also include an oxidation process oxidizing the third semiconductor layer 190 to increase a germanium concentration of the first semiconductor layer 170 (Block 1600-3). It will be understood that the oxidation process may drive germanium in the third semiconductor layer 190 into the first semiconductor layer 170 and may extract silicon in the first semiconductor layer 170 through the upper surface of first semiconductor layer 170 contacting the third semiconductor layer 190.

In some embodiments, the oxidation process may continue until at least a majority of germanium in the third semiconductor layer 190 is driven into the first semiconductor layer 170. For example, the oxidation process may convert a portion of the first semiconductor layer 170 into the second semiconductor layer. In some embodiments, the oxidation process may convert the entire first semiconductor layer 170 into the second semiconductor layer. Furthermore, the oxidation process may continue in order to reach as high a germanium concentration as desired in the second semiconductor layer. For example, the oxidation process may continue until a germanium concentration of the second semiconductor layer becomes higher than a germanium concentration of the third semiconductor layer 190 or may continue until the second semiconductor layer becomes substantially pure germanium.

A process temperature of the oxidation process may be in a range of about 900° C. to about 1300° C. It will be understood that the silicate glass layer 110 may reflow and may freely expand its volume during the oxidation process since a reflow temperature of the silicate glass layer 110 may be lower than the process temperature of the oxidation process. Accordingly, the first semiconductor layer 170 may also freely adjust its size during the oxidation process and strain built in the second semiconductor layer may be reduced. Because of reduced strain, extended defects (e.g., dislocations or stacking faults) caused by the strain may also be reduced.

It will be understood that a Ge condensation process can be optimized, following different approaches know in the art. These approaches may include using several oxidation cycles, at different oxidation temperatures, in which the oxidation temperature is reduced as a germanium concentration of a layer in which germanium is condensed is increased. These oxidation cycles may be alternated with Si—Ge interdiffusion cycles in a non-oxidizing ambient.

In some embodiments, a Ge condensation process, including forming the third semiconductor layer 190 and the capping layer 210 followed by an oxidation process and optional interdiffusion cycles, may also be repeated several times. Parameters, such as thicknesses of the third semiconductor layer 190 and the capping layer 210, a germanium concentration of the third semiconductor layer 190, times and temperatures of oxidation processes and interdiffusion cycles as well as the number of cycles, may be adjusted for each subsequent condensation process. The capping layer 210 and the third semiconductor layer 190 may be removed after the oxidation process.

Figure 5:
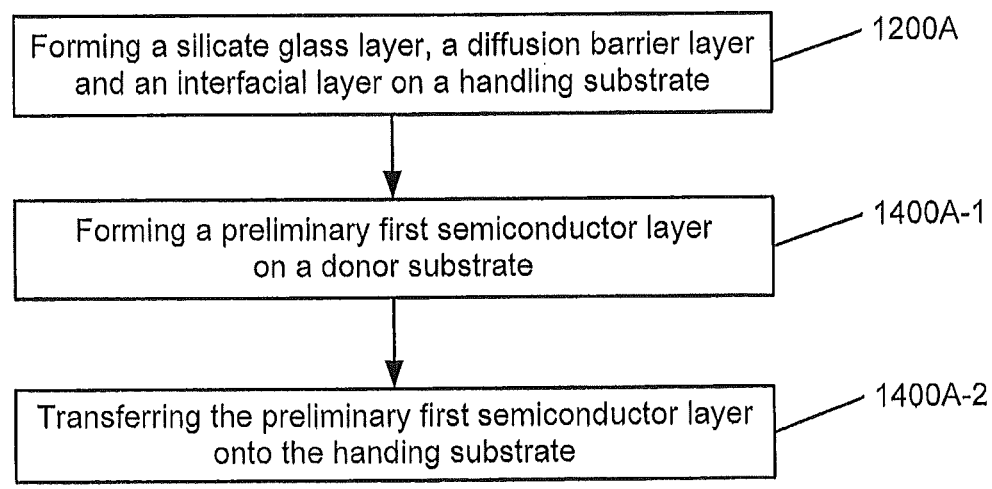
FIG. 5 is a flowchart illustrating a method of forming a semiconductor on insulator substrate according to some embodiments of the present inventive concept.
Figure 6:
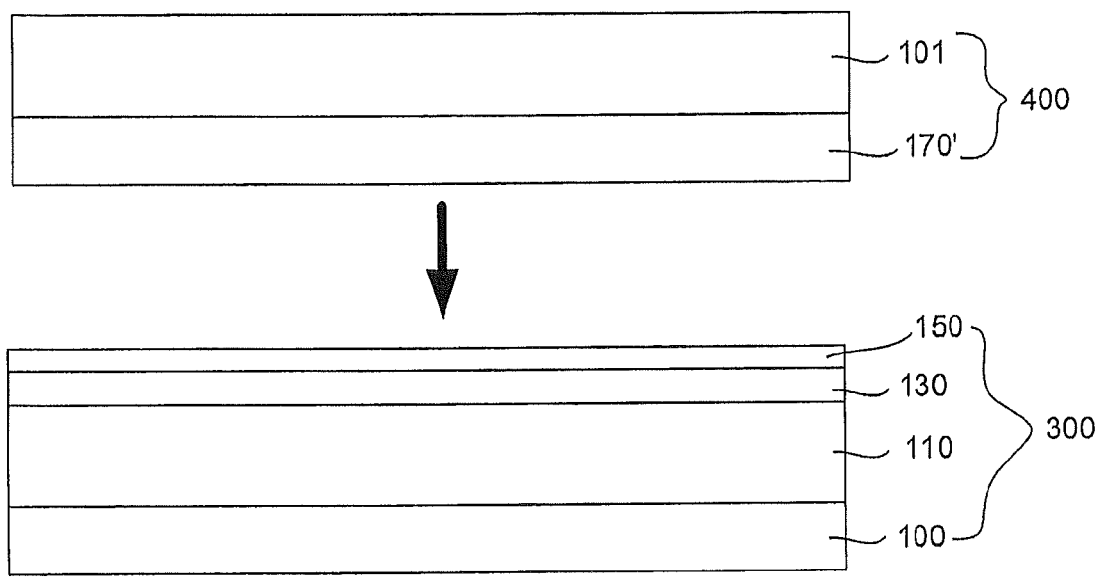
FIG. 6 is a cross-sectional view illustrating an intermediate structure provided in a method of forming a semiconductor on insulator substrate according to some embodiments of the present inventive concept.

FIG. 5 is a flowchart illustrating a method of forming a semiconductor on insulator substrate according to some embodiments of the present inventive concept. FIG. 6 is a cross-sectional view illustrating an intermediate structure provided in a method of forming a semiconductor on insulator substrate according to some embodiments of the present inventive concept.

Referring to FIGS. 5 and 6, a method of forming a semiconductor on insulator substrate may include forming a handling wafer 300 (Block 1200A). Forming the handling wafer 300 may be substantially the same as or similar to operations illustrated in Block 1200 in FIG. 1. Specifically, forming the handling wafer 300 may include forming a silicate glass layer 110, a diffusion barrier layer 130, and an interfacial layer 150 on a handling substrate 100 of the handling wafer 300. The diffusion barrier layer 130 may be disposed between the silicate glass layer 110 and the interfacial layer 150.

Further, the method of forming a semiconductor on insulator substrate may include forming a donor wafer 400. Forming the donor wafer 400 may include forming a preliminary first semiconductor layer 170' on a donor substrate 101 of the donor wafer 400 (Block 1400A-1). In some embodiments, the preliminary first semiconductor layer 170' may be an upper portion of the donor substrate 101 and an interface between the preliminary first semiconductor layer 170' and the donor substrate 101 may be defined by an implanted region. Specifically, light elements (e.g., hydrogen) may be implanted into the donor substrate 101 at a certain depth to form an implanted region and an upper portion of the donor substrate 101 disposed on the implanted region may be used as the preliminary first semiconductor layer 170'. A thickness of the preliminary first semiconductor layer 170' may be determined by a depth of the implanted region. In some embodiments, the preliminary first semiconductor layer 170' may be formed using a deposition process.

The donor substrate 101 may be, for example, a bulk silicon substrate or a semiconductor on insulator substrate (SOI) (e.g., silicon on insulator). In some embodiments, the donor substrate 101 may include one or more semiconductor materials, for example, Si, Ge, SiGe, GaP, GaAs, SiC, SiGeC, InAs or InP. The preliminary first semiconductor layer 170' and the donor substrate 101 may include the same material.

The method of forming a semiconductor on insulator substrate may also include transferring the preliminary first semiconductor layer 170' onto the handling substrate 100 of the handling wafer 300 (Block 1400A-2). It will be understood that the transferred preliminary first semiconductor layer 170' can be used as the first semiconductor layer 170 in FIG. 2. Transferring the preliminary first semiconductor layer 170' may be performed using, for example, a Smart-Cut® process.

Figure 7:
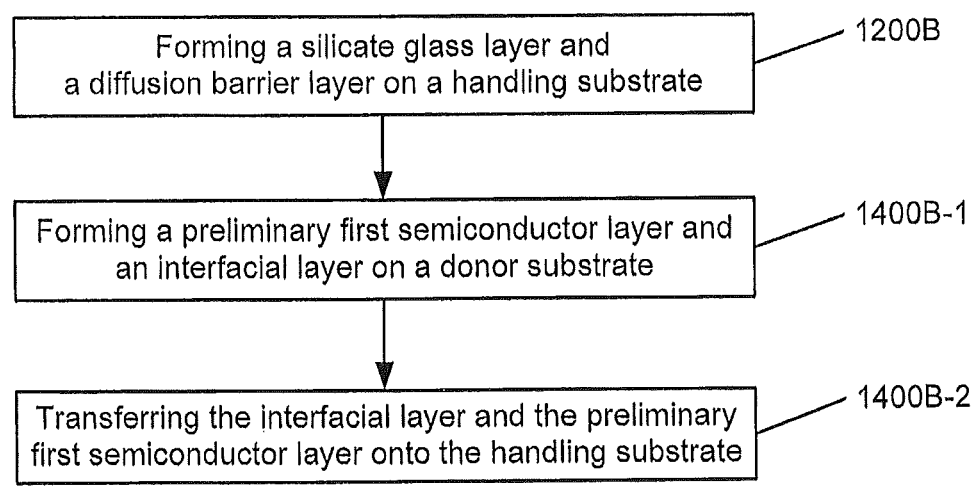
FIG. 7 is a flowchart illustrating a method of forming a semiconductor on insulator substrate according to some embodiments of the present inventive concept.
Figure 8:
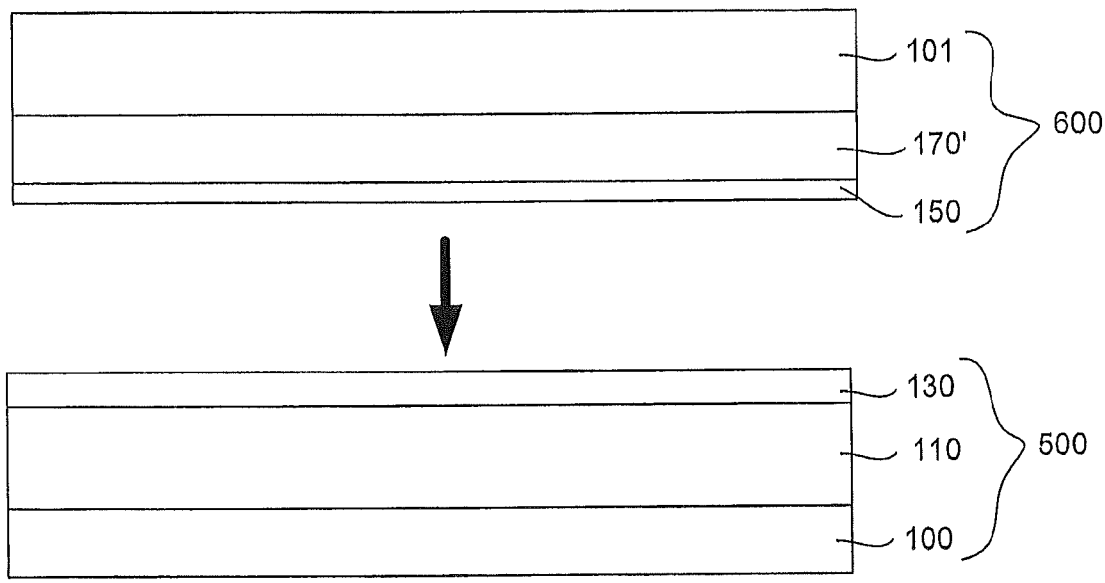
FIG. 8 is a cross-sectional view illustrating an intermediate structure provided in a method of forming a semiconductor on insulator substrate according to some embodiments of the present inventive concept.

FIG. 7 is a flowchart illustrating a method of forming a semiconductor on insulator substrate according to some embodiments of the present inventive concept. FIG. 8 is a cross-sectional view illustrating an intermediate structure provided in a method of forming a semiconductor on insulator substrate according to some embodiments of the present inventive concept.

Referring to FIGS. 7 and 8, a method of forming a semiconductor on insulator substrate may include forming a handling wafer 500 (Block 1200B). Forming the handling wafer 500 may include forming a silicate glass layer 110 and a diffusion barrier layer 130 on a handling substrate 100 of the handling wafer 500. The silicate glass layer 110 may be disposed between the handling substrate 100 and the diffusion barrier layer 130. Forming the silicate glass layer 110 and the diffusion barrier layer 130 may be substantially the same as or similar to operations, which are described with reference to FIGS. 1 and 2.

Further, the method of forming a semiconductor on insulator substrate may include forming a donor wafer 600. Forming the donor wafer 600 may include forming a preliminary first semiconductor layer 170' and an interfacial layer 150 on a donor substrate 101 of the donor wafer 600 (Block 1400B-1). In some embodiments, the preliminary first semiconductor layer 170' may be an upper portion of the donor substrate 101 defined by an implantation process that is described with reference to FIGS. 5 and 6. The interfacial layer 150 may be formed using, for example, a thermal oxidation process or a deposition process. When the preliminary first semiconductor layer 170' is defined by an implantation process, the implantation process may be performed before or after forming the interfacial layer 150.

The donor substrate 101 may be, for example, a bulk silicon substrate or a semiconductor on insulator substrate (SOI) (e.g., silicon on insulator). In some embodiments, the donor substrate 101 may include one or more semiconductor materials, for example, Si, Ge, SiGe, GaP, GaAs, SiC, SiGeC, InAs or InP. The preliminary first semiconductor layer 170' and the donor substrate 101 may include the same material.

The method of forming a semiconductor on insulator substrate may also include transferring the interfacial layer 150 and the preliminary first semiconductor layer 170' onto the handling substrate 100 of the handling wafer 500 (Block 1400B-2). It will be understood that the transferred preliminary first semiconductor layer 170' can be used as the first semiconductor layer 170 in FIG. 2. Transferring the interfacial layer 150 and the preliminary first semiconductor layer 170' may be performed using, for example, a Smart-Cut® process.

It will be further understood that germanium layers or high germanium content silicon germanium layers formed by a method according to some embodiments of the present inventive concept may include low defects and may be used as a channel layer of MOS devices or seed layer for III-V semiconductor material.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed:

1. A method of forming a semiconductor on insulator substrate, the method comprising:
   forming a handling wafer, wherein forming the handling wafer comprises:
      forming a silicate glass layer on a handling substrate;
      forming a diffusion barrier layer comprising nitride on the silicate glass layer, the silicate glass layer extending between the handling substrate and the diffusion barrier layer; and
      forming an interfacial layer on the diffusion barrier layer, the diffusion barrier layer extending between the silicate glass layer and the interfacial layer; and
   transferring a first semiconductor layer from a donor wafer onto the handling wafer, the first semiconductor layer contacting the interfacial layer after said transferring; and
   converting at least a portion of the first semiconductor layer into a second semiconductor layer having a germanium concentration therein that is higher than a germanium concentration of the first semiconductor layer.

2. The method of claim 1, wherein said converting comprises:
   forming a third semiconductor layer comprising germanium directly contacting the first semiconductor layer; and
   oxidizing the third semiconductor layer to drive germanium therein into the first semiconductor layer.

3. The method of claim 2, further comprising forming a capping oxide layer on the third semiconductor layer prior to said oxidizing.

4. The method of claim 2, wherein said oxidizing is performed at a temperature higher than a reflow temperature of the silicate glass layer.

5. The method of claim 4, wherein the silicate glass layer comprises borophosphosilicate glass (BPSG), phosphorus silicate glass (PSG) or boron silicate glass (BSG).

6. The method of claim 1, wherein the diffusion barrier layer is a silicon nitride layer.

7. The method of claim 6, wherein forming the diffusion barrier layer comprises implanting nitrogen ions into an upper surface of the silicate glass layer.

8. The method of claim 6, wherein a thickness of the silicon nitride layer is in a range of about 0.5 nm to about 10 nm.

9. The method of claim 1, wherein the interfacial layer is a silicon oxide layer.

10. The method of claim 9, wherein a thickness of the silicon oxide layer is in a range of about 0.5 nm to about 10 nm.

11. A method of forming a semiconductor on insulator substrate, the method comprising:
   forming a handling wafer, wherein forming the handling wafer comprises:
      forming a silicate glass layer on a handling substrate; and
      forming a diffusion barrier layer comprising nitride on the silicate glass layer, the silicate glass layer extending between the handling substrate and the diffusion barrier layer; and
   transferring a first semiconductor layer and an interfacial layer, which are sequentially stacked on a donor substrate, onto the handling wafer, the interfacial layer contacting the diffusion barrier layer after said transferring; and
   converting at least a portion of the first semiconductor layer into a second semiconductor layer having a germanium concentration therein that is higher than a germanium concentration of the first semiconductor layer.

12. The method of claim 11, wherein said converting comprises:
   forming a third semiconductor layer comprising germanium directly contacting the first semiconductor layer; and
   oxidizing the third semiconductor layer to drive germanium therein into the first semiconductor layer.

13. The method of claim 12, wherein said oxidizing is performed at a temperature higher than a reflow temperature of the silicate glass layer.

14. The method of claim 11, wherein the diffusion barrier layer is a silicon nitride layer.

15. The method of claim 14, wherein a thickness of the silicon nitride layer is in a range of about 0.5 nm to about 10 nm.

16. The method of claim 11, wherein the interfacial layer is a silicon oxide layer.

17. The method of claim 16, wherein a thickness of the silicon oxide layer is in a range of about 0.5 nm to about 10 nm.

18. The method of claim 13, wherein the silicate glass layer comprises borophosphosilicate glass (BPSG), phosphorus silicate glass (PSG) or boron silicate glass (BSG).

19. The method of claim 14, wherein forming the diffusion barrier layer comprises implanting nitrogen ions into an upper surface of the silicate glass layer.

20. The method of claim 16, wherein the silicon oxide layer is formed by a thermal oxidation process.

* * * * *